United States Patent
Nishizawa

(10) Patent No.: US 9,007,146 B2
(45) Date of Patent: Apr. 14, 2015

(54) DUPLEXER

(75) Inventor: Toshio Nishizawa, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 519 days.

(21) Appl. No.: 13/314,881

(22) Filed: Dec. 8, 2011

(65) Prior Publication Data
US 2012/0194294 A1  Aug. 2, 2012

(30) Foreign Application Priority Data

Jan. 31, 2011 (JP) .................................. 2011-018277

(51) Int. Cl.
| H01P 5/12 | (2006.01) |
| H03H 7/46 | (2006.01) |
| H03H 9/05 | (2006.01) |
| H03H 9/70 | (2006.01) |
| H03H 9/72 | (2006.01) |

(52) U.S. Cl.
CPC ........... *H03H 9/0576* (2013.01); *H03H 9/0571* (2013.01); *H03H 9/706* (2013.01); *H03H 9/725* (2013.01)

(58) Field of Classification Search
USPC .................................. 333/126–129, 132, 134
See application file for complete search history.

(56) References Cited

U.S. PATENT DOCUMENTS

| 2003/0098757 A1 | 5/2003 | Iwamoto et al. |
| 2006/0138672 A1 | 6/2006 | Sakinada et al. |
| 2009/0302970 A1 | 12/2009 | Hatano et al. |
| 2012/0126912 A1* | 5/2012 | Tsutsumi et al. ............. 333/132 |

FOREIGN PATENT DOCUMENTS

| JP | 2002-100932 A | 4/2002 |
| JP | 2003-163570 A | 6/2003 |
| JP | 2006-203149 A | 8/2006 |
| JP | 2009-054829 A | 3/2009 |
| JP | 2009-296508 A | 12/2009 |

OTHER PUBLICATIONS

Korean Office Action dated Apr. 16, 2013, in a counterpart Korean patent application 10-2011-0116344.

* cited by examiner

*Primary Examiner* — Robert Pascal
*Assistant Examiner* — Kimberly Glenn
(74) *Attorney, Agent, or Firm* — Chen Yoshimura LLP

(57) ABSTRACT

A duplexer includes a package substrate having layers stacked, a transmission filter and a reception filter that are provided on an upper surface of a first layer that is one of the layers of the package substrate, the transmission and reception filters being acoustic wave filters, a metal pattern provided on the upper surface of the first layer and formed to surround the transmission and reception filters, a transmission line provided on an upper surface of a second layer that is one of the layers of the package substrate and is positionally lower than the first layer, the transmission line electrically connecting the transmission filter and a transmission terminal together, and a reception line that is provided on the upper surface of the second layer and electrically connects the reception filter and a reception terminal. The thickness of the first layer is greater than that of the second layer.

10 Claims, 3 Drawing Sheets

DUPLEXER

CROSS-REFERENCE TO RELATED APPLICATION

This application is based upon and claims the benefit of priority of the prior Japanese Patent Application No. 2011-018277, filed on Jan. 31, 2011, the entire contents of which are incorporated herein by reference.

FIELD

An aspect of the invention discussed herein is related to a duplexer. Another aspect of the invention is related to a duplexer having a package substrate composed of multiple layers stacked.

BACKGROUND

Mobile communication device such as cellular phones and portable information terminal equipment are widely spread with the developments in the information-oriented society. For example, the cellular phones use RF bands as high as 800 MHz~1.0 GHz and 1.5 GHz~2.0 GHz. In order to cope with such RF bands, duplexers using acoustic wave filters such as surface acoustic wave (SAW) filters or film bulk acoustic resonators (FBARs) are used.

Japanese Patent Application Publication No. 2006-203149 discloses an electronic device in which an acoustic wave filter that is flip-chip mounted on an upper surface of a package substrate is sealed with solder or the like. Japanese Patent Application Publication No. 2009-296508 discloses a duplexer in which a package substrate composed of multiple layers stacked is used and a transmission acoustic wave filter and a reception acoustic wave filter, which are flip-chip mounted on an upper surface of the package substrate, is sealed with solder or the like.

Recently, the cellular phones have made further progress in multiband and multimode and have become increasingly sophisticated. For example, the cellular phones are equipped with an auxiliary wireless interface such as wireless local area network (LAN) or global positioning system (GPS). In the above situation, there is an increasing demand for reduction in the size and height of the duplexer.

In order to reduce the height of the duplexer, it is considered to thin the package substrate. A thinned package substrate may be realized by thinning each layer thereof. In this case, patterns formed on the layers become closer to each other. For example, a transmission line provided on a layer may be electromagnetically coupled with a metal formed on another layer. Similarly, a reception line provided on a layer may be electromagnetically coupled with a metal formed on another layer. Thus, a signal leakage may occur between the transmission and reception lines via the metals, and the isolation characteristic between the transmission and reception lines may deteriorate.

SUMMARY OF THE INVENTION

According to another aspect of the present invention, there is provided a duplexer including: a package substrate having layers stacked; a transmission filter and a reception filter that are provided on an upper surface of a first layer that is one of the layers of the package substrate, the transmission and reception filters being acoustic wave filters; a metal pattern provided on the upper surface of the first layer and formed to surround the transmission and reception filters; a transmission line provided on an upper surface of a second layer that is one of the layers of the package substrate and is positionally lower than the first layer, the transmission line electrically connecting the transmission filter and a transmission terminal together; and a reception line that is provided on the upper surface of the second layer and electrically connects the reception filter and a reception terminal, wherein the thickness of the first layer is greater than that of the second layer.

DETAILED DESCRIPTION

A description is now be given of embodiments with reference to the accompanying drawings.

First Embodiment

Figure 1:
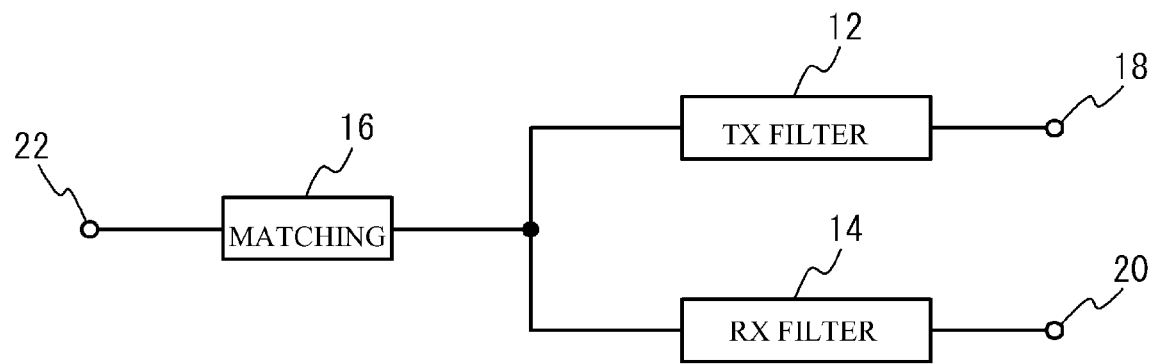
FIG. 1 is a block diagram of a duplexer according to a first embodiment.

FIG. 1 is a block diagram of a duplexer according to a first embodiment. Referring to FIG. 1, a transmission filter 12 is connected to a transmission node 18, and a reception filter 14 is connected to a reception node 20. The transmission filter 12 and the reception filter 14 are connected to an antenna 22 via a matching circuit 16. Another connection may be made. For example, only the reception filter 14 is connected to the antenna 22 via the matching circuit 16, while the transmission filter 12 is connected to the antenna 22 without passing through the matching circuit 16.

By way of another example, the transmission filter 12 is connected to the antenna 22 via the matching circuit 16, while the reception filter 14 is connected to the antenna 22 without passing through the matching circuit 16. That is, at least one of the transmission filter 12 and the reception filter 14 is connected to the antenna 22 via the matching circuit 16.

Figure 2:
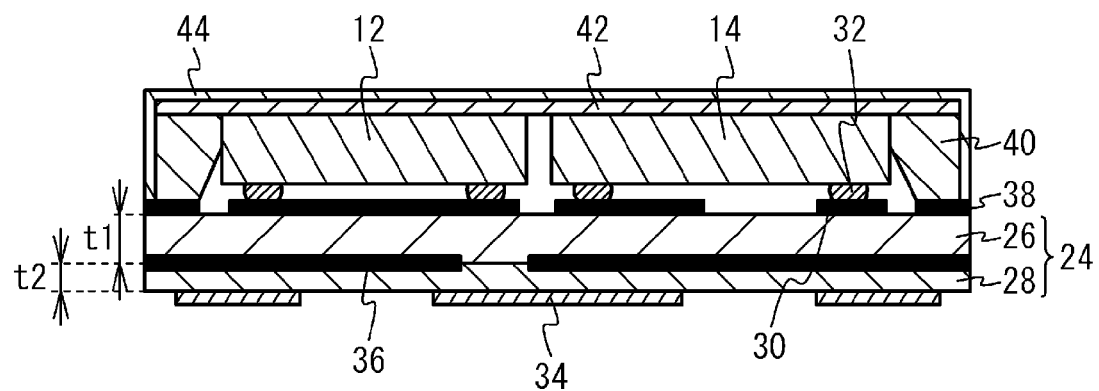
FIG. 2 is a cross-sectional view of the duplexer of the first embodiment.

FIG. 2 is a cross-sectional view of the duplexer of the first embodiment. Referring to FIG. 2, a package substrate 24 is composed of multiple layers stacked, which include a die attach layer 26 and a line pattern/foot pad layer 28 in this example. The die attach layer 26 has a thickness t1 of, for example 50 μm to 100 μm, and the line pattern/foot pad layer 28 has a thickness t2 of, for example, 30 μm and 55 μm. The thickness t1 is greater than the thickness t2 (t1>t2). More specifically, t1 may be 100 μm and t2 may be 50 μm, for example.

Pads 30 are provided on the upper surface of the die attach layer 26. The transmission filter 12 and the reception filter 14 are facedown flip-chip mounted on the pads via bumps 32. The bumps 32 may be gold (Au) or solder and a thickness of about 20 μm. The transmission filter 12 and the reception filter 14 have a height of, for example 0.1~0.28 mm. Foot pads 34 are provided on the back surface of the line pattern/foot pad layer 28. The die attach layer 26 and the line pattern/foot pad layer 28 may be made of an insulator such as ceramic. The transmission filter 12, the reception filter 14 and the foot pads 34 are electrically interconnected by lines 36 and vias made of an electrically conductive material. The package substrate 24 may be a printed-circuit board.

The transmission filter 12 and the reception filter 14 may be ladder type filters using SAW resonators. The transmission filter 12 and the reception filters 14 have mutually different passbands. The transmission filter 12 and the reception filter 14 may be a lattice type filter or a multimode filter composed of SAW resonators. Another configuration uses resonators using bulk waves instead of the SAW resonators.

A seal ring 38 formed by a metal pattern is provided on the upper surface of the die attach layer 26 along the outer periphery of the die attach layer 26. Solder 40 is joined to the seal ring 38. Preferably, the seal ring 38 is made of a metal having good wettability to the solder 40, which may be tungsten plated with gold.

A metal cap 42 is provided so as to extend over the solder 40, the transmission filter 12 and the reception filter 14. The metal cap 42 may be made of a metal such as Kovar and may be 25 µm thick, for example. The transmission filter 12 and the reception filter 14 are sealed with the solder 40 and the metal cap 42.

A protection film 44 is provided so as to cover the solder 40 and the metal cap 42. The protection film 44 may be formed by, for example, a metal film, which may be nickel deposited to a thickness of about 10 nm by electrolytic plating. Besides nickel, a copper plated film or a vapor deposition film may be used to form the protection film 44. The protection film 44 may be formed by a resin film such as epoxy resin. The protection film 44 suppresses deformation of the solder 40 inside the protection film 44 due to external force or heat.

Figure 3A:
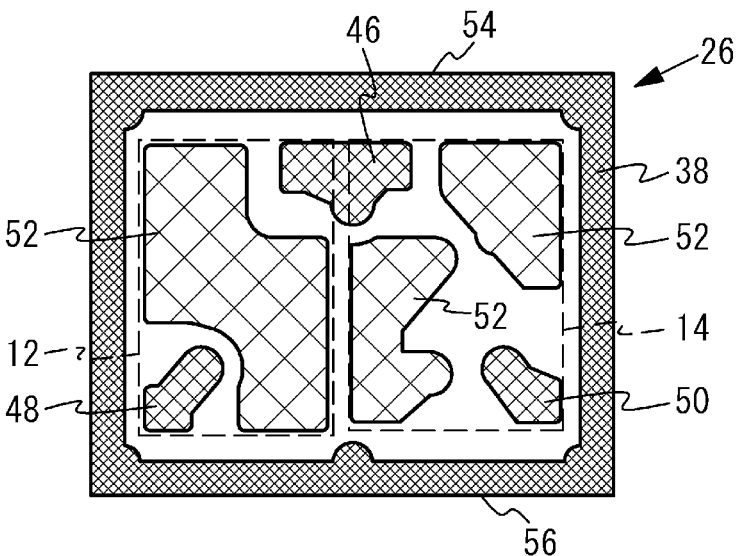
FIG. 3A is a plan view of a die attach layer.
Figure 3B:
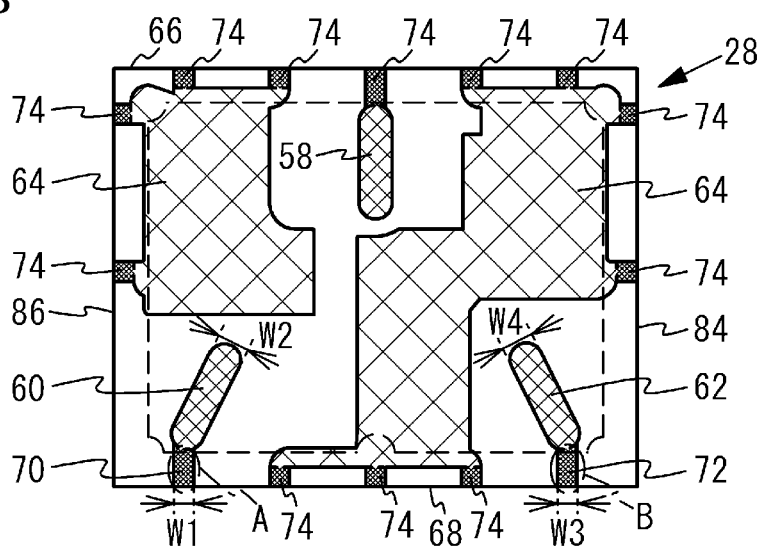
FIG. 3B is a plan view of a line pattern/foot pad layer.
Figure 3C:
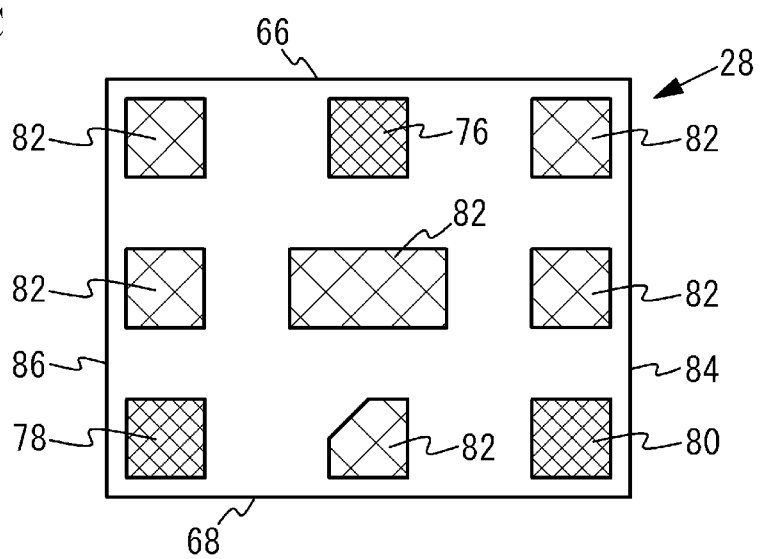
FIG. 3C is a view of a back surface of the line pattern/foot pad layer.

A description is now given of the layers of the package substrate 24 with reference to FIGS. 3A through 3C. FIG. 3A is a plan view of the die attach layer 26, FIG. 3B is a plan view of the line pattern/foot pad layer 28, and FIG. 3C illustrates a back surface of the line pattern/foot pad layer 28.

Referring to FIG. 3A, pads are provided on the upper surface of the die attach layer 26. The pads are made of tungsten plated with gold and are 10~15 µm thick, for example. The pads include an antenna pad 46, a transmission pad 48, a reception pad 50 and ground pads 52. The pads may be made of another conductive material such as copper plated with gold. The upper surface of the die attach layer 26 has a rectangular shape. The antenna pad 46 is close to the center of a first side 54 of the rectangular shape. The transmission pad 48 is close to one of two ends a second side 56 opposite to the first side 54, and the reception pad 50 is close to the other end. With the above arrangement, it is possible to secure sufficient spacings between the pads 46, 48 and 50 and improve the isolation characteristics between these pads. The ground pad 52 may be provided between the antenna pad 46, the transmission pad 48 and the reception pad 50. It is thus possible to improve the isolation characteristic between the pads 46, 48 and 50.

The transmission filter 12 is flip-chip mounted on the antenna pad 46, the transmission pad 48 and the ground pad 52 by using bumps. An input electrode of the transmission filter 12 is connected to the transmission pad 48, and a ground electrode of the transmission filter 12 is connected to the ground pad 52. An output electrode of the transmission filter 12 is connected to the antenna pad 46.

The reception filter 14 is flip-chip mounted on the antenna pad 46, the reception pad 50 and the ground pad 52 by using bumps. An output electrode of the reception filter 14 is connected to the reception pad 50, and a ground electrode of the reception filter 14 is connected to the ground pad 52. An input electrode of the reception filter 14 is connected to the antenna pad 46.

The seal ring 38 is provided on the upper surface of the die attach layer 26 so as to surround the transmission filter 12 and the reception filter 14. The seal ring 38 is electrically connected to a ground line formed on the upper surface of the line pattern/foot pad layer 28 by means of vias. The seal ring 38 is set at the ground potential.

As illustrated in FIG. 3B, lines, which may be defined by metal deposition and patterning, are provided on the upper surface of the line pattern/foot pad layer 28. The lines may be made of, for example, tungsten and may be 7~10 µm thick. The lines include an antenna line 58, a transmission line 60, a reception line 62 and ground lines 64. The lines may be made of another conductive material such as copper. The lines 58, 60, 62 and 64 are electrically connected to the pads 46, 48, 50 and 52 by means of vias.

The upper and back surfaces of the line pattern/foot pad layer 28 have a rectangular shape. The antenna line 58 is close to the center of a first side 66 of the rectangular shape. The transmission line 60 is close to one of two ends of a second side 68 opposite to the first side 66. The reception line 62 is close to the other end of the second side 68. The ground lines 64 are provided between the antenna line 58 and the transmission line 60 and between the antenna line 58 and the reception line 62. With this arrangement, it is possible to improve the isolation characteristics between the lines 58, 60 and 62. The transmission line 60 and the reception line 62 do not extend over an area (depicted by a broken line in FIG. 3B) defined by projecting the seal ring 38 onto the upper surface of the line pattern/foot pad layer 28.

A first conductor line 70 is provided so as to extend to the transmission line 60 from the outer periphery (the second side 68) of the line pattern/foot pad layer 28. A second conductor line 72 is provided so as to extend to the reception line 62 from the outer periphery (the second side 68) of the line pattern/foot pad layer 28. That is, the first conductor line 70 is provided so as to extend in an area A that is part of an area defined by projecting the seal ring 38 onto the upper surface of the die attach layer 26 and is closest to the transmission line 60. Similarly, the second conductor line 72 is provided so as to extend in an area B that is part of the area defined by projecting the seal ring 38 onto the upper surface of the die attach layer 26 and is closest to the reception line 62. The first conductor line 70 is electrically connected to the transmission line 60, and the second conductor line 72 is electrically connected to the reception line 62.

The first conductor line 70 has a width W1 smaller than a width W2 of the transmission line 60. The second conductor line 72 has a width W3 smaller than a width W4 of the reception line 62. For example, in a case where W2 is approximately equal to W4, it is preferable that W1 is approximately equal to W3. In this case, W1 and W3 are smaller than W2 and W4.

Third conductor lines 74 are provided so as to extend to the antenna line 58 and the ground lines 64 from the outer periphery of the line pattern/foot pad layer 28. The third conductor lines 74 are provided so as to extend in the area defined by projecting the seal ring 38 onto the upper surface of the line pattern/foot pad layer 28. The third conductor lines 74 are electrically connected to the antenna line 58 or the ground lines 64.

The first conductor line 70, the second conductor line 72 and the third conductor lines 74 are used for electrolytic plating in order to supply electricity to all patterns to be plated with gold for the purpose of simultaneously forming the transmission lines 60 of integrally formed multiple package substrates prior to cutting.

As illustrated in FIG. 3C, foot pads are provided on the back surface of the line pattern/foot pad layer 28. The foot pads may be made of a conductor such as tungsten plated with gold. The foot pads include an antenna terminal 76, a transmission terminal 78, a reception terminal 80 and ground terminals 82. The terminals 76, 78, 80 and 82 are electrically connected to the antenna line 58, the transmission line 60, the reception line 62 and the ground lines 64 by using the vias, respectively. The antenna terminal 76 is connected to the antenna 22 via the matching circuit 16 (see FIG. 1).

The antenna terminal 76 is close to the center of the first side 66 out of the four sides of the rectangular back surface of the line pattern/foot pad layer 28. The transmission terminal 78 is close to one of the two ends of the second side 68 opposite to the first side 66, and the reception terminal 80 is close to the other end of the second side 68. FIG. 3C depicts six ground terminals 82. Two ground terminals 82 are close to the ends of the first side 66. There is one ground terminal 82 close to the center of a third side 84 orthogonal to the first side 66. There is one ground terminal 82 close to the center of a fourth side 86 orthogonal to the first side 66. There is one ground terminal 82 close to the center of the second side 68. The last one of the ground terminals 86 is located in the center of the back surface of the line pattern/foot pad layer 28. With the above arrangements of the pads, it is possible to improve the isolation characteristics between the terminals 76, 78 and 80.

Figure 4:
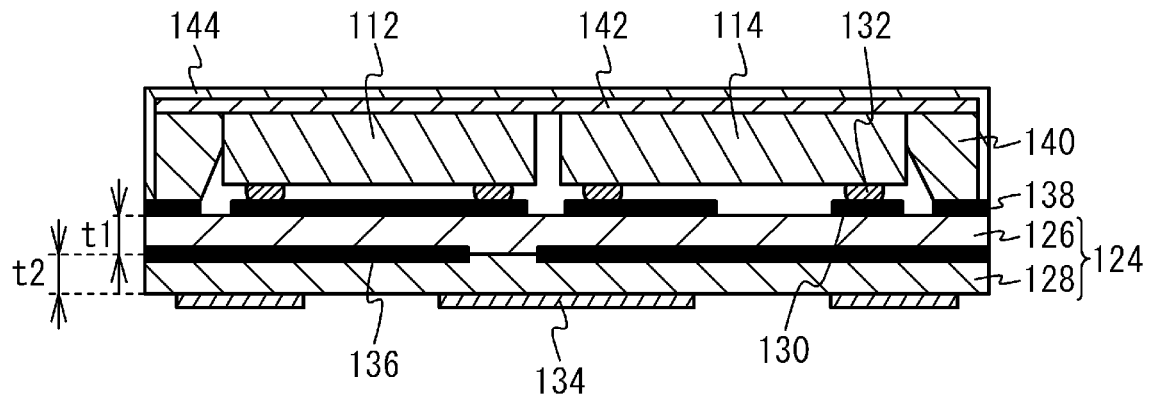
FIG. 4 is a cross-sectional view of a duplexer according to a first comparative example.

Now, a duplexer according to a comparative example is described in order to describe effects of the duplexer of the first embodiment. FIG. 4 is a cross-sectional view of a duplexer according to a first comparative example. Referring to FIG. 4, a package substrate 124 is composed of a die attach layer 126 and a line pattern/foot pad layer 128, which are stacked. The thickness t1 of the die attach layer 126 is equal to the thickness t2 of the line pattern/foot pad layer 128.

On the upper surface of the die attach layer 26, there are provided pads 130, which include an antenna pad, a transmission pad, a reception pad and ground pads. A transmission filter 112 and a reception filter 114 are facedown flip-chip mounted on the pads 130 by using bumps 132. On the back surface of the line pattern/foot pad layer 128, there are provided foot pads 134, which include an antenna terminal, a transmission terminal, a reception terminal and ground terminals. The transmission filter 112 and the reception filter 114 are electrically connected to the foot pads 134 via lines 136 provided on the upper surface of the line pattern/foot pad layer 134 as well as vias. The lines include an antenna line, a transmission line, a reception line and ground lines.

A seal ring 138 is provided on the upper surface of the die attach layer 126 so as to surround the transmission filter 112 and the reception filter 114. Solder 140 is bonded on the seal ring 138. A metal cap 142 is provided so as to extend over the transmission filter 112 and the reception filter 114. The transmission filter 112 and the reception filter 114 are sealed with the solder 140 and the metal cap 142. A protection film 144 is provided so as to cover the solder 140 and the metal cap 142.

In the duplexer of the first comparative example, as illustrated in FIG. 4, the thickness t1 of the die attach layer 126 and the thickness t2 of the line pattern/foot pad layer 128 are equal to each other. In contrast, in the duplexer of the first embodiment, as illustrated in FIG. 2, the thickness t1 of the die attach layer 26 is greater than the thickness t2 of the line pattern/foot pad layer 28. In a case where the duplexer of the first comparative example and that of the first embodiment are configured to have an equal thickness of the package substrates, the duplexer of the first embodiment has a larger spacing between the seal ring provided on the upper surface of the die attach layer and the line pattern provided on the upper surface of the line pattern/foot pad layer than that of the duplexer of the first comparative example. In a case where the package substrate is thinned for the purpose of reducing the height of the duplexer, the first embodiment has less electromagnetic couplings between the transmission line and the seal ring and between the reception line and seal ring than that of the first comparative example.

As described above, the duplexer of the first embodiment as illustrated in FIG. 2 is configured to have the seal ring 38 that surrounds the transmission filter 12 and the reception filter mounted on the die attach layer 26 of the package substrate 24. The transmission line 60 and the reception line 62 are formed on the upper surface of the line pattern/foot pad layer 28 that is one layer lower than the die attach layer 26. The thickness t1 of the die attach layer 26 is greater than the thickness t2 of the line pattern/foot pad layer 28. With the above arrangements, it is possible to reduce the electromagnetic coupling between the transmission line 60 and the seal ring 38 and that between the reception line 62 and the seal ring 38. It is thus possible to reduce the height of the duplexer and suppress leakage of the transmission signal over the transmission line 60 to the reception line 62 via the seal ring 38. According to the first embodiment, it is possible to realize both reduction in the height of the duplexer and improvement in the isolation characteristic between the transmission line 60 and the reception line 62.

For the purpose of improving the isolation characteristic between the transmission line 60 and the reception line 62, it is preferable that the ratio t2/t1 is equal to or smaller than 0.8 and is more preferably equal to or smaller than 0.5.

The transmission line 60 and the reception line 62 may extend in an area defined by projecting the seal ring 38 onto the upper surface of the line pattern/foot pad layer 28. However, as illustrated in FIG. 3B, it is preferable that the transmission line 60 and the reception line 62 do not extend in the projected area but extend in an area other than the projected area. It is thus possible to secure a large spacing between the transmission line 60 and the seal ring 38 and a large spacing between the reception line 62 and the seal ring 38 and to reduce the electromagnetic coupling between the transmission line 60 and the seal ring 38 and that between the reception line 62 and the seal ring 38. It is thus possible to suppress leakage of the transmission signal over the transmission line 60 to the reception line 62 via the seal ring 38 and to further improve the isolation characteristic between the transmission line 60 and the reception line 62.

As illustrated in FIG. 3B, the transmission line 60 and the reception line 62 are located on the second side 68 of the line pattern/foot pad layer 28 and are close to the area defined by projecting the seal ring 38 onto the upper surface of the line pattern/foot pad layer 28. Since the distance between the transmission line 60 and the reception line 62 via the seal ring 38 is short, the transmission signal over the transmission line 60 is likely to be leaked to the reception line 62 via the seal ring 38. In this case, it is possible to more effectively suppress leakage of the transmission signal to the reception line 62 via the seal ring 38 from the transmission line 60 by setting the thickness t1 of the die attach layer 26 greater than the thickness t2 of the line pattern/foot pad layer 28.

As illustrated in FIG. 3B, the first conductor line 70 and the second conductor line 72 are provided in the area defined by projecting the seal ring 38 onto the upper surface of the line pattern/foot pad layer 28 (depicted by the broken line in FIG.

3B). The first conductor line 70 is electrically connected to the transmission line 60, and the second conductor line 72 is electrically connected to the reception line 62. The width of the first conductor line 70 may be equal to that of the transmission line 60. As illustrated in FIG. 3B, the width of the first conductor line 70 is preferably smaller than that of the transmission line 60. For example, the width of the first conductor line 70 is preferably equal to or smaller than 0.8 times the width of the transmission line 60, and is more preferably equal to or smaller than 0.5 times the width of the transmission line 60. Similarly, the width of the second conductor line 72 may be equal to that of the reception line 62. As illustrated in FIG. 3B, the width of the second conductor line 72 is preferably smaller than that of the reception line 62. For example, the width of the second conductor line 72 is preferably equal to or smaller than 0.8 times the width of the reception line 62, and is more preferably equal to or smaller than 0.5 times the width of the reception line 62. A description is now given of the reason why the first conductor line 70 is preferably narrower than the transmission line 60, and the second conductor line 72 is preferably narrower than the reception line 62.

The first conductor line 70 is at the same potential as the transmission line 60 and is positioned closer to the seal ring 38 than the transmission line 60. Thus, as the package substrate 24 becomes thinner, the electromagnetic coupling between the first conductor line 70 and the seal ring 38 becomes more considerable. Similarly, the second conductor line 72 is at the same potential as the reception line 62 and is positioned closer to the seal ring 38 than the reception line 62. Thus, as the package substrate 24 becomes thinner, the electromagnetic coupling between the second conductor line 72 and the seal ring 38 becomes more considerable. With the above in mind, the electromagnetic coupling between the first conductor line 70 and the seal ring 38 and that between the second conductor line 72 and the seal ring 38 are reduced by narrowing the first conductor line 70 and the second conductor line 72 in order to reduce the area where the first conductor line 70 or the second conductor line 72 overlap the seal ring 38. More particularly, as illustrated in FIG. 3B, the first conductor line 70 is narrower than the transmission line 60, and the second conductor line 72 is narrower than the reception line 62. With this arrangement, it is attempted to reduce the electromagnetic coupling between the first conductor line 70 and the seal ring 38 and that between the second conductor line 72 and the seal ring 38. It is thus possible to suppress leakage of the transmission signal over the transmission line 60 to the reception line 62 via the seal ring 38 and improve the isolation characteristic between the transmission line 60 and the reception line 62.

The first embodiment may be varied so as to have one of the two unique arrangements, one of which includes the first conductor line 70 narrower than the transmission line 60, and the other of which includes the second conductor line 72 narrower than the reception line 62. In other words, the width of one of the first conductor line 70 and the second conductor line 72 is smaller than that of one of the transmission line 60 and the reception line 62. Even with this variation, it is thus possible to suppress leakage of the transmission signal over the transmission line 60 to the reception line 62 via the seal ring 38 and improve the isolation characteristic between the transmission line 60 and the reception line 62.

The first embodiment may be varied so that the first conductor line 70 has a portion narrower than the transmission line 60 and the second conductor line 72 has a portion narrower than the reception line 62. Even with this variation, it is thus possible to suppress leakage of the transmission signal over the transmission line 60 to the reception line 62 via the seal ring 38 and improve the isolation characteristic between the transmission line 60 and the reception line 62. The first conductor line 70 and the second conductor line 72 are not limited to patterns for electrolytic plating but may be conductor patterns that extend the area defined by projecting the seal ring 38 onto the upper surface of the line pattern/foot pad layer 28 and are electrically connected to the transmission line 60 and the reception line 62.

As has been described with reference to FIG. 3B, it is preferable that the seal ring 38 is electrically connected to the ground potential. Thus, the solder 40 and the metal cap 42 are equal to the ground potential, and are capable of functioning to shield the transmission filter 12 and the reception filter 14 against external electromagnetic waves. The seal ring 38 may not be connected to the ground potential electrically.

The first embodiment may be varied to provide a resin film with which the transmission filter 12 and the reception filter 14 are sealed instead of the solder 40.

The first embodiment may be varied so that the reception filter 14 has a balanced output instead of the unbalanced output. The filter having the balanced output has two reception terminals 80 in FIG. 3C.

The first embodiment may be varied so that the transmission filter 12 and the reception filter 14 is formed on a single chip, which is mounted on the package substrate 24.

The first embodiment may be varied to have a multilayer substrate composed of at least three layers. In this case, the thickness of a first layer having an upper surface on which the transmission and reception filters are mounted and the metal pattern is provided so as to surround these filters is greater than the thickness of a second layer having a position vertically lower than that of the first layer and an upper surface on which the transmission and reception lines are provided. The metal pattern on the upper surface of the first layer may be not a seal member and may be partly broken as long as the metal pattern functionally surrounds the transmission and reception filters.

Second Embodiment

Figure 5:
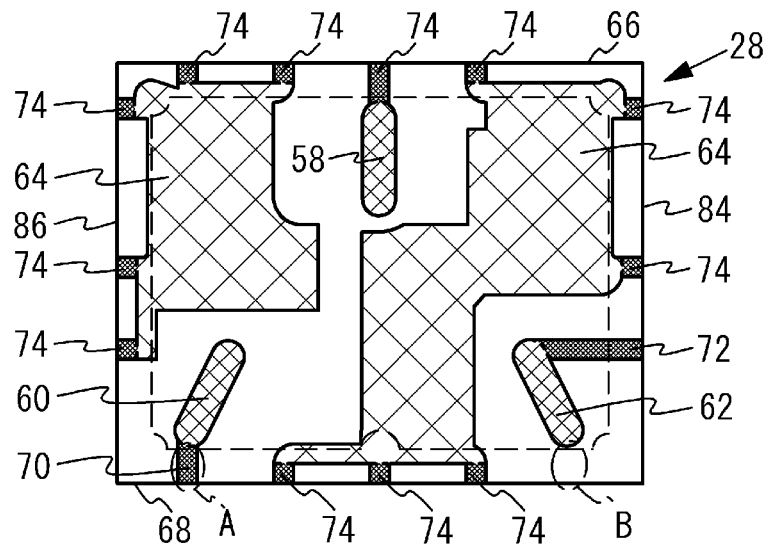
FIG. 5 is a plan view of a line pattern/foot pad layer used to form a package substrate employed in a duplexer according to a second embodiment.

FIG. 5 is a plan view of the line pattern/foot pad layer 28 of a package substrate employed in a duplexer according to a second embodiment. Referring to FIG. 5, the position of the second conductor line 72 provided on the upper surface of the line pattern/foot pad layer 28 is different from that used in the first embodiment. The second conductor illustrated in FIG. 5 extends from the third side 84 of the rectangular line pattern/foot pad layer 28 to the reception line 62 close to the second side 68 orthogonal to the third side 84. The other structures of the second embodiment are the same as those of the first embodiment illustrated in FIGS. 1 through 3C, and a description thereof is omitted here.

According to the second embodiment, as illustrated in FIG. 5, the first conductor line 70 extends to the transmission line 60 from the second side 68, and the second conductor line 72 extends to the reception line 62 from the third side 84. The first conductor line 70 is provided in an area A that is a portion of the area (illustrated by the broken line) defined by projecting the seal ring 38 onto the upper surface of the line pattern/foot pad layer 28 and is closest to the transmission line 60. The second conductor line 72 is not provided in an area B that is a portion of the projected area and is closest to the reception line 62 but is provided in an area other than an area that connects the area A and the area B in the shortest distance. It is thus possible to increase the distance between the first conductor line 70 and the second conductor line 72 along the area defined by projecting the seal ring 38 onto the upper surface of the line pattern/foot pad layer 28, as compared with the first embodiment illustrated in FIG. 3B. That is, it is possible to increase the distance between the first conductor line 70 and the second conductor line 72 via the seal ring 38. It is thus possible to suppress leakage of the transmission signal over the transmission line 60 to the reception line 62 via the seal ring 38 and improve the isolation characteristic between the transmission line 60 and the reception line 62.

The second embodiment may be varied so that at least one of the first conductor line 70 and the second conductor line 72 is provided so as to extend in an area other than an area that connects the area A closest to the transmission line 60 and the area B closest to the reception line 62 in the shortest distance. As illustrated in FIG. 5, it is preferable that the first conductor line 70 and the second conductor line 72 are provided in areas that are included in the projected area and extend to the different sides of the line pattern/foot pad layer 28.

Both the first conductor line 70 and the second conductor line 72 may be provided so as to extend in areas other than the area that connects the areas A and B in the shortest distance. In this case, it is possible to further suppress leakage of the transmission signal over the transmission line 60 to the reception line 62 via the seal ring 38 and to further improve the isolation characteristic between the transmission line 60 and the reception line 62.

Third Embodiment

Figure 6:
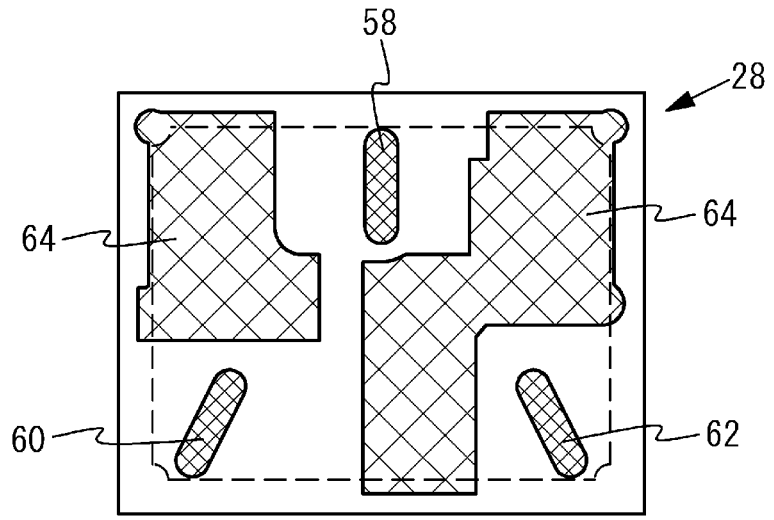
FIG. 6 is a plan view of a line pattern/foot pad layer used to form a package substrate employed in a duplexer according to a third embodiment.

A duplexer according to a third embodiment has an exemplary structure in which the transmission line 60 and the like are formed by electroless plating. FIG. 6 is a plan view of the line pattern/foot pad layer 28 employed in the duplexer of the third embodiment. Referring to FIG. 6, the duplexer of the third embodiment does not have the first conductor line 70, the second conductor line 72 and the third conductor lines 74 that are used in the first and second embodiments. This is because electroless plating does not need patterns for electrolytic plating. The transmission line 60, the reception line 62 and the ground lines 64 are formed by gold plating using electroless plating. The other structures of the third embodiment are the same as those of the first embodiment illustrated in FIGS. 1 through 3C, and a description thereof is omitted here.

The duplexer of the third embodiment does not have the conductor patterns electrically connected to the transmission line 60 and the reception line 62 in the area (depicted by the broken line in FIG. 6) defined by projecting the seal ring 38 onto the upper surface of the line pattern/foot pad layer 28. It is thus possible to further suppress leakage of the transmission signal over the transmission line 60 to the reception line 62 via the seal ring 38 and to further improve the isolation characteristic between the transmission line 60 and the reception line 62.

The present invention is not limited to the specifically disclosed embodiments, but includes other embodiments and variations within the scope of the claimed invention.

What is claimed is:

1. A duplexer comprising:
   a package substrate having layers stacked;
   a transmission filter and a reception filter that are provided on an upper surface of a first layer that is one of the layers of the package substrate, the transmission and reception filters being acoustic wave filters;
   a metal pattern provided on the upper surface of the first layer and formed to surround the transmission and reception filters;
   a transmission line provided on an upper surface of a second layer that is one of the layers of the package substrate and is positionally lower than the first layer, the transmission line electrically connecting the transmission filter and a transmission terminal together; and
   a reception line that is provided on the upper surface of the second layer and electrically connects the reception filter and a reception terminal,
   wherein the thickness of the first layer is greater than that of the second layer.

2. The duplexer according to claim 1, where the transmission and reception lines are provided in an area other than an area defined by projecting the metal pattern onto the upper surface of the second layer.

3. The duplexer according to claim 1, further comprising:
   a first conductor line that is electrically connected to the transmission line and extends in a projected area defined by projecting the metal pattern onto the upper surface of the second layer; and
   a second conductor line that is electrically connected to the reception line and extends in the projected area,
   at least one of the first and second conductor lines being narrower than a corresponding one of the transmission and reception lines that is at an equal potential.

4. The duplexer according to claim 3, wherein the first conductor line is narrower than the transmission line, and the second conductor line is narrower than the reception line.

5. The duplexer according to claim 1, further comprising:
   a first conductor line that is electrically connected to the transmission line and extends in a projected area defined by projecting the metal pattern onto the upper surface of the second layer; and
   a second conductor line that is electrically connected to the reception line and extends in the projected area,
   at least one of the first and second conductor lines being provided in an area other than an area that connects a first area closest to the transmission line and a second area closest the reception line in a shortest distance, the first and second areas being included in an area defined by projecting the metal pattern onto the upper surface of the second layer.

6. The duplexer according to claim 5, wherein both the first and second conductor lines are provided in the area other than the area that connects the first and second areas in the shortest distance.

7. The duplexer according to claim 1, wherein no conductors connected to the transmission and reception lines are provided in an area defined by projecting the metal pattern onto the upper surface of the second layer.

8. The duplexer according to claim 1, wherein the metal pattern is connected to a ground potential.

9. The duplexer according to claim 1, further comprising solder with which the transmission and reception filters are sealed.

10. The duplexer according to claim 1, wherein the second layer has a rectangular shape viewed from a top thereof, and the transmission and reception lines are close to one of four sides of the rectangular shape and are close to an area defined by projecting the metal pattern onto the upper surface of the second layer.

* * * * *